US008160506B2

(12) United States Patent
Rofougaran

(10) Patent No.: US 8,160,506 B2
(45) Date of Patent: *Apr. 17, 2012

(54) METHOD AND SYSTEM FOR TRANSMISSION AND/OR RECEPTION OF SIGNALS UP TO EXTREMELY HIGH FREQUENCIES UTILIZING A DELAY CIRCUIT

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 715 days.

This patent is subject to a terminal disclaimer.

(21) Appl. No.: 11/860,106

(22) Filed: Sep. 24, 2007

(65) Prior Publication Data

US 2009/0079475 A1 Mar. 26, 2009

(51) Int. Cl.
*H04B 1/38* (2006.01)

(52) U.S. Cl. .......... 455/73; 375/261; 375/224; 327/122; 327/261; 455/313

(58) Field of Classification Search ...... 455/73
See application file for complete search history.

(56) References Cited

U.S. PATENT DOCUMENTS

| 5,809,064 A * | 9/1998 | Fenton et al. ............ 375/150 |
| 5,977,805 A | 11/1999 | Vergnes et al. |
| 6,259,283 B1 * | 7/2001 | Nguyen ............... 327/122 |
| 6,370,189 B1 * | 4/2002 | Morrison et al. ......... 375/224 |
| 6,717,479 B2 * | 4/2004 | Suda ..................... 331/57 |
| 7,005,900 B1 * | 2/2006 | Nguyen ............... 327/122 |
| 7,495,489 B2 * | 2/2009 | Wu et al. .............. 327/161 |
| 2002/0153972 A1 * | 10/2002 | Hershtig ................ 333/202 |
| 2004/0017847 A1 | 1/2004 | Alberth, Jr. et al. |
| 2004/0080372 A1 * | 4/2004 | Chen ................... 330/311 |
| 2006/0141973 A1 * | 6/2006 | Behrens et al. ........... 455/313 |
| 2007/0273422 A1 * | 11/2007 | Kuo et al. ............. 327/261 |
| 2008/0232506 A1 * | 9/2008 | Fujita et al. ............ 375/295 |
| 2009/0079475 A1 * | 3/2009 | Rofougaran ........... 327/122 |

OTHER PUBLICATIONS

USPTO Office Action Mailed, Aug. 6, 2009 for U.S. Appl. No. 11/860,152, filed Sep. 24, 2007.
Nov. 4, 2009 Response filed with USPTO in reply to Office Action Mailed, Aug. 6, 2009 for U.S. Appl. No. 11/860,152, filed Sep. 24, 2007.
USPTO Office Action dated May 25, 2010, U.S. Appl. No. 11/860,076, filed Sep. 24, 2007, Inventor: Ahmadreza Rofougaran.
Aug. 25, 2010 Response to Office Action dated May 25, 2010, U.S. Appl. No. 11/860,076, filed Sep. 24, 2007.

(Continued)

*Primary Examiner* — Temesgh Ghebretinsae
*Assistant Examiner* — David Bilodeau
(74) *Attorney, Agent, or Firm* — Farjami & Farjami LLP

(57) ABSTRACT

Aspects of a method and system for transmission and/or reception of signals up to EHF utilizing a delay circuit are provided. In this regard, a transceiver may comprise at least one delay circuit which may, in turn, comprise a plurality of delay elements and a variable capacitance. The delay circuit may be enabled to delay a first signal, via at least a portion of the delay elements and via the variable capacitance, to generate a second signal that is 90° phase shifted relative to said first signal. Additionally, the delay circuit may be enabled to mix the first signal with the second signal to generate a third signal that is twice a frequency of the first signal. The third signal may be utilized for up-conversion and/or down-conversion of signals to and/or from baseband, intermediate frequencies, and/or RF frequencies of up to EHF.

24 Claims, 6 Drawing Sheets

OTHER PUBLICATIONS

USPTO Office Action dated Oct. 28, 2010, U.S. Appl. No. 11/860,076, filed Sep. 24, 2007, Inventor: Ahmadreza Rofougaran.
Jan. 28, 2011 Response to Office Action dated Oct. 28, 2010, U.S. Appl. No. 11/860,076, filed Sep. 24, 2007.
Ahmadreza Rofougaran, Office Action Mailed Apr. 14, 2010, U.S. Appl. No. 11/860,128, filed Sep. 24, 2007.
Response filed Jul. 15, 2010 in response to Ahmadreza Rofougaran, Office Action Mailed Apr. 14, 2010, U.S. Appl. No. 11/860,128, filed Sep. 24, 2007.
Ahmadreza Rofougaran, Office Action Mailed Aug. 19, 2010 U.S. Appl. No. 11/860,128, filed Sep. 24, 2007.
Response filed Nov. 16, 2010 in response to Ahmadreza Rofougaran, Office Action Mailed Aug. 19, 2010 U.S. Appl. No. 11/860,128, filed Sep. 24, 2007.
Ahmadreza Rofougaran, Office Action Mailed Dec. 8, 2010 U.S. Appl. No. 11/860,128, filed Sep. 27, 2007.

* cited by examiner

METHOD AND SYSTEM FOR TRANSMISSION AND/OR RECEPTION OF SIGNALS UP TO EXTREMELY HIGH FREQUENCIES UTILIZING A DELAY CIRCUIT

CROSS-REFERENCE TO RELATED APPLICATIONS/INCORPORATION BY REFERENCE

This patent application makes reference to:
U.S. patent application Ser. No. 11/860,076 filed on Sep. 24, 2007, now published as United States Patent Application Publication No. 2009/0079474;
U.S. patent application Ser. No. 11/860,128 filed on Sep. 24, 2007, now published as United States Patent Application Publication No. 2009/0080541; and
U.S. patent application Ser. No. 11/860,152 filed on Sep. 24, 2007, now published as United States Patent Application Publication No. 2009/0079482.

Each of the above stated applications is hereby incorporated herein by reference in its entirety.

FIELD OF THE INVENTION

Certain embodiments of the invention relate to signal processing. More specifically, certain embodiments of the invention relate to a method and system for transmission and/or reception of signals up to EHF utilizing a delay circuit.

BACKGROUND OF THE INVENTION

As wireless communications continue to evolve and become increasingly relied upon for the conveyance of data, new challenges continue to face wireless system designers. In this regard, the increasing number of wireless technologies and wireless devices has led to increasing congestion in many frequency bands. Accordingly, efforts exist to utilize less congested frequency bands.

For example, in 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this designated portion of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. In this regard, there may be certain drawbacks associated with 60 GHz communications. For example, 60 GHz signals may provide markedly different communications channel and propagation characteristics. In this regard, 60 GHz radiation is partly absorbed by oxygen in the air. Accordingly, 60 GHz communications suffer from increased attenuation with distance as compared to, for example, 2.4 GHz. On the other hand, there may be advantages associated with 60 GHz communications. For example, since a very large bandwidth of 7 GHz is available, very high data rates may be achieved.

Shrinking features size of CMOS processes, for example, is one factor enabling development products and technologies for 60 GHz communications. However, even when fabricated on the smallest processes, conventional methods and circuit topologies are often unable to realize signal generation circuits which can generate signals sufficiently high in frequency to enable technologies such as 60 GHz communications.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for transmission and/or reception of signals up to extremely high frequencies utilizing a delay circuit substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for transmission and/or reception of signals up to extremely high frequencies utilizing a delay circuit. In this regard, a transceiver may comprise at least one delay circuit which may, in turn, comprise a plurality of delay elements and a variable capacitance. The delay circuit may be enabled to delay a first signal, via at least a portion of the delay elements and via the variable capacitance, to generate a second signal that is 90° phase shifted relative to said first signal. Additionally, the delay circuit may be enabled to mix the first signal with the second signal to generate a third signal that is twice a frequency of the first signal. The third signal may be utilized for up-conversion and/or down-conversion of signals to and/or from baseband, intermediate frequencies, and/or RF frequencies of up to EHF. A plurality of the delay circuits may be cascaded. In this manner, one or more frequency conversions may utilize outputs of one or more of the cascaded delay circuits.

Figure 1:
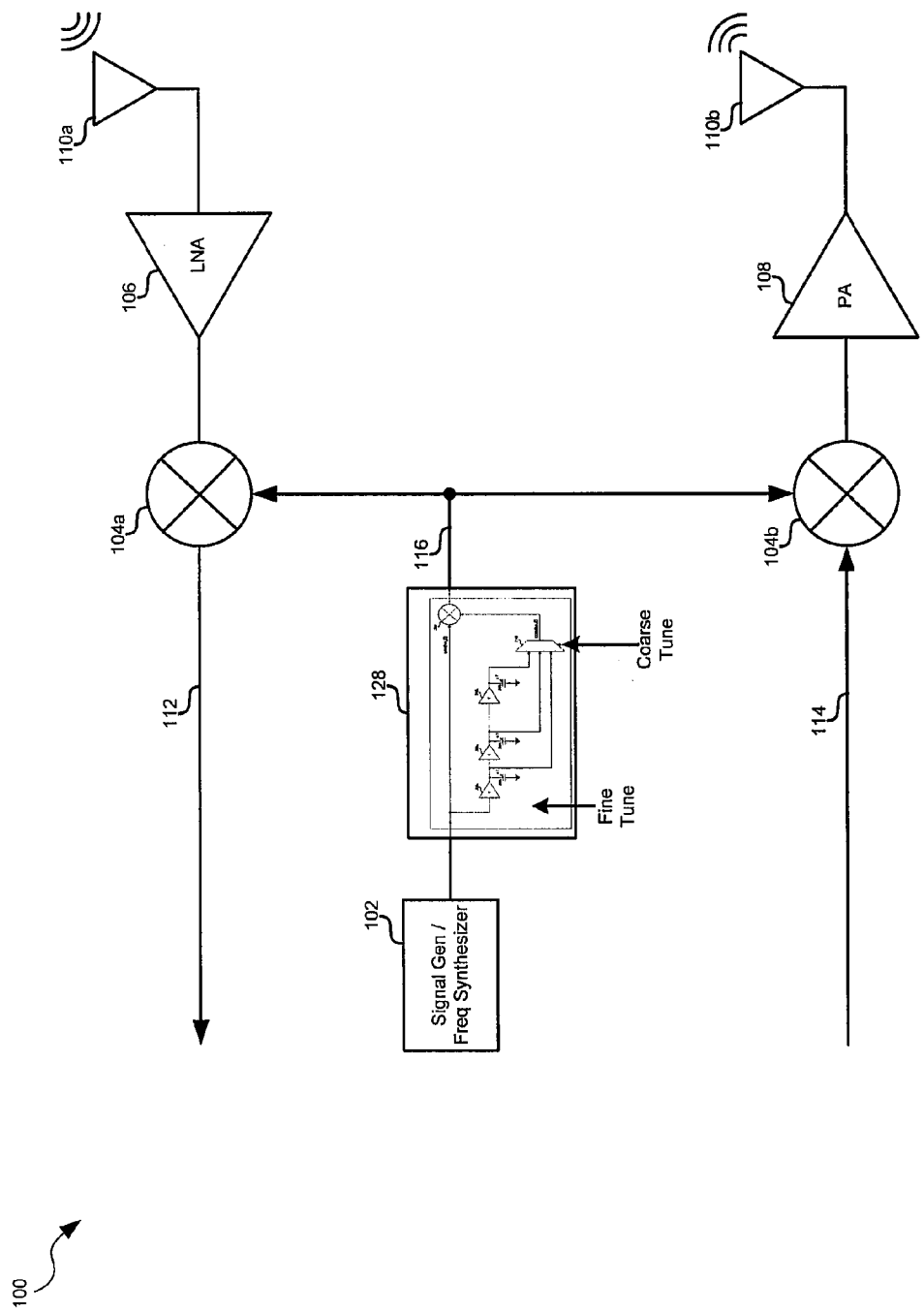
FIG. 1 is a diagram of a transceiver comprising a delay circuit which may enable transmission and/or reception of signals up to EHF, in accordance with an embodiment of the invention.

FIG. 1 is a diagram of a transceiver comprising a delay circuit which may enable transmission and/or reception of signals up to EHF, in accordance with an embodiment of the invention. Referring to FIG. 1 there is shown a transceiver 100 which may be all or a portion of the RF receiver 623a of FIG. 6, for example. The transceiver 100 may comprise a signal generator 102, a delay circuit 128, mixers 104a and 104b, a low noise amplifier (LNA) 106, a power amplifier 108, and antennas 110a and 110b.

The signal generator 102 may comprise suitable logic, circuitry, and/or code that may enable generating a sine wave. In this regard, the signal generator 102 may be enabled to generate a reference frequency for use, for example, as a local oscillator. For example, the signal generator 102 may comprise one or more PLLs. Accordingly, the maximum frequency which the signal generator 102 may be capable of generating may be limited due, for example, to settling times and/or physical constraints.

The delay circuit 128 may comprise suitable logic, circuitry, and/or code for outputting a frequency that is twice an input frequency. In this regard, the delay circuit 128 may be may be as described in FIG. 4.

The mixers 104a and 104b may comprise suitable logic, circuitry, and/or code that may enable generation of intermodulation products resulting from mixing the input signal 412 and the delayed signal 414. In this regard, the mixers 104a and 104b may be similar to or the same as the mixer 404 described in FIG. 4.

The LNA 106 may comprise suitable logic, circuitry, and/or code that may enable buffering and/or amplification of received RF signals. In this regard, the gain of the LNA 106 may be adjustable to enable reception of signals of varying strength. Accordingly, the LNA 106 may receive one or more control signals from a processor such as the processors 625 and 629 of FIG. 6.

The PA 108 may comprise suitable logic, circuitry, and/or code that may enable buffering and/or amplification of a RF signal and outputting the signal to an antenna for transmission. In this regard, the gain of the PA 108 may be adjustable and may enable transmitting signals of varying strength. Accordingly, the PA 108 may receive one or more control signals from a processor such as the processors 625 and 629 of FIG. 6.

The antennas 110a and 110b may comprise suitable logic, circuitry, and/or code that may enable reception and/or transmission of signals of up to EHF. In various embodiments of the invention there may be separate transmit and receive antennas, as depicted, or there may be a single antenna for both transmit and receive functions.

The signal generator 102 may generate a reference signal of frequency F1. The delay circuit 128 may receive the signal F1 and may output a local oscillator (LO) signal 116 of frequency 2*F1. The frequency of the LO signal 116 may, for example, be chosen to be $(F_{RF} \pm F_{baseband})$. Accordingly, the signal generator 102 may generate a signal at ½ $(F_{RF} \pm F_{baseband})$.

In an exemplary receive operation, RF signals may be received by the antenna 110a and may be conveyed to the LNA 106. The LNA 106 may amplify the received signal and convey it to the mixer 104a. In this regard, the gain of the LNA may be adjusted based on received signal strength. Additionally, the gain may be controlled via one or more control signals from, for example, a processor such as the processors 625 and 629 of FIG. 6. The LO signal 116 may be coupled to the mixer 104a such that the received signal of frequency $F_{RF}$ may be down-converted to a baseband signal 112. The baseband signal 112 may be conveyed, for example, to a baseband processor such as the baseband processor 629 of FIG. 6.

In an exemplary transmit operation, a baseband signal 114 may be conveyed to the mixer 104b. The LO signal 116 may be coupled to the mixer 104b and the baseband signal 114, of frequency $F_{baseband}$, may be up-converted to RF. The RF signal may be conveyed to the PA 108 for transmission via the antenna 110b. In this regard, the gain of the PA 108 may be adjusted via one or more control signals from, for example, a processor such as the processors 625 and 629 of FIG. 6.

Figure 2:
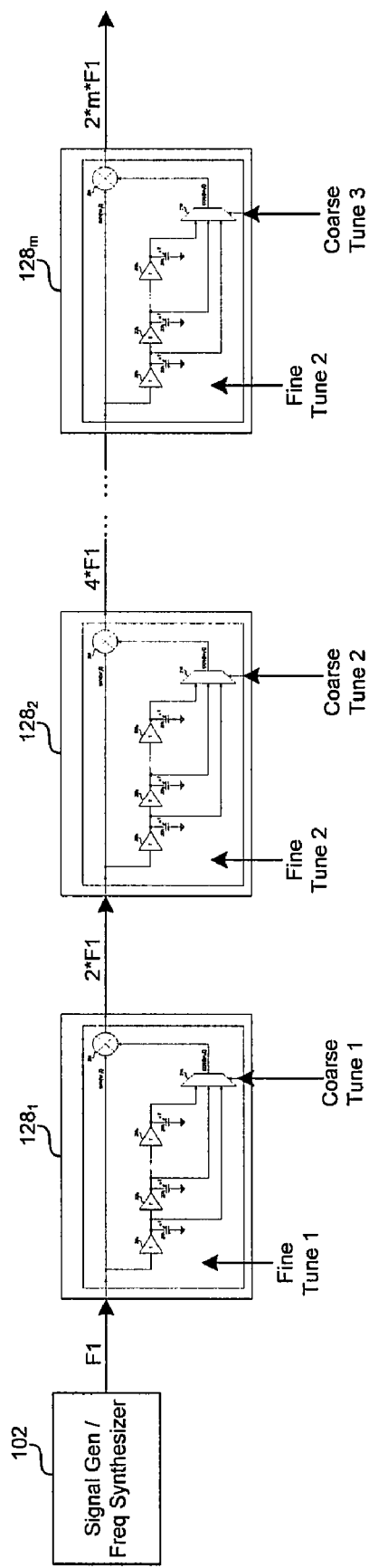
FIG. 2 is a block diagram illustrating the cascading of multiple digital delay line blocks, in accordance with an embodiment of the invention.

FIG. 2 is a block diagram illustrating the cascading of multiple delay circuits, in accordance with an embodiment of the invention. Referring to FIG. 2 there is shown a signal generator 102 and a plurality of delay circuits $128_1, \ldots, 128_m$.

Figure 4:
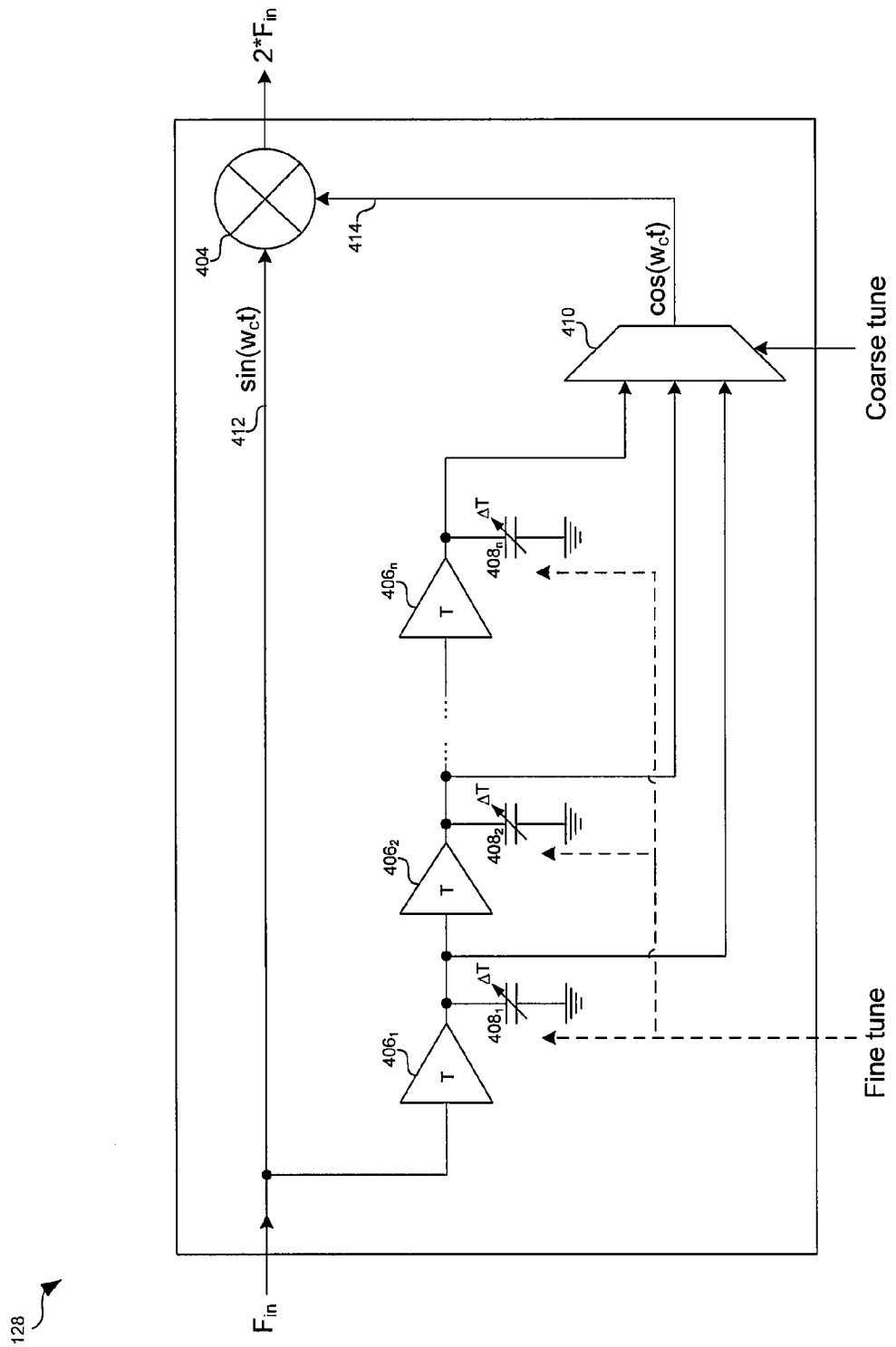
FIG. 4 is a block diagram illustrating a delay circuit for the generation of signals of up to extremely high frequencies, in accordance with an embodiment of the invention.

Each of the 'm' delay circuits $128_1, \ldots, 128_m$ may be similar to or the same as the delay circuit 128 described in FIG. 4. Accordingly, each delay circuit $128_i$ may be enabled to output a signal twice the frequency of the signal input to the delay circuit $128_i$. Accordingly, the frequency of the $m^{th}$ delay circuit may be equal to $$F_{out} = 2^m \cdot F_{in} \qquad \text{EQ. 1}$$

where $F_{in}$ is the input to the first delay circuit and $F_{out}$ is the output frequency of the $m^{th}$ delay circuit.

In operation, each delay circuit $128_1, \ldots, 128_m$ may be controlled via a course control input and a fine control input. In this regard, the course control input of the $i^{th}$ delay circuit may control the number of delay elements comprising the delay circuit $128_i$ through which the signal propagates. Additionally the fine control input of the $i^{th}$ delay circuit $128_i$ may control the capacitance at the output of one or more delay elements. In this regard, the coarse control and/or fine control inputs may be manually controlled or programmatically controlled via, for example, one or more processors, such as the processor 625 of FIG. 6.

Figure 3:
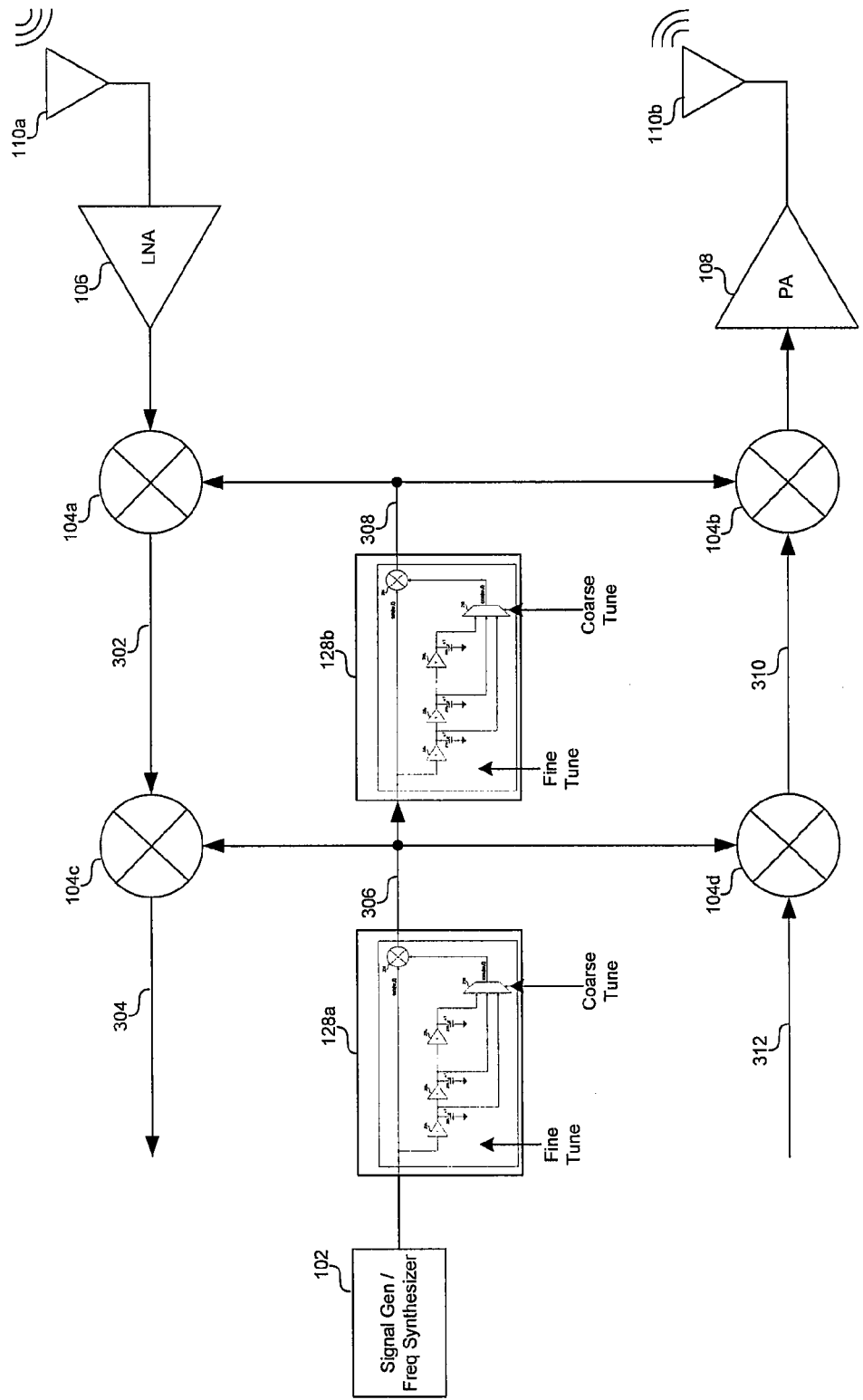
FIG. 3 is a diagram of a transceiver comprising a plurality of delay circuits which may enable transmission and/or reception of signals up to EHF, in accordance with an embodiment of the invention.

FIG. 3 is a diagram of a transceiver comprising a plurality of delay circuits which may enable transmission and/or reception of signals up to EHF, in accordance with an embodiment of the invention. Referring to FIG. 3 there is shown a transceiver 600 comprising a signal generator 102, delay circuits 128a and 128b, mixers 104a, 104b, 104c, 104d, an LNA 106, a PA 108, and antennas 110a and 110b.

The signal generator 102, the LNA 106, and the PA 108 may be as described in FIG. 1. The mixers 104a, 104b, 104c, 104d may be similar to or the same as the mixers 104a and 104b described in FIG. 1. The delay circuits 128 may each be as described in FIG. 4. Accordingly, signals of frequency $2^m \cdot F_{in}$ may be generated by cascading 'm' delay circuits as described in FIG. 2.

In operation, the signal generator 102 may generate a reference signal of frequency F1. The delay circuit 128a may receive the signal F1 and may output a local oscillator (LO) signal 306 of frequency 2*F1. The delay circuit 128b may receive the signal 306 and may output a local oscillator (LO) signal 308 of frequency 4*F1. In various embodiments of the invention, additional delay circuits 128 cascaded with delay circuits $128_1$ and $128_2$ may further increase the LO frequency as depicted in FIG. 2. In this regard, F1 and the number of delay circuits may be chosen based on desired RF and/or IF frequencies.

In an exemplary receive operation, RF signals may be received by the antenna 110a and may be conveyed to the LNA 106. The LNA 106 may amplify the received signal and convey it to the mixer 104a. In this regard, the gain of the LNA 106 may be adjusted based on received signal strength. Additionally, the gain of the LNA 106 may be controlled via one or more control signals from, for example, a processor such as the processors 625 and 629 of FIG. 6. The LO signal 308 may be conveyed to the mixer 104a such that the received signal of frequency $F_{RF}$ may be down-converted to an IF signal 302. The LO signal 306 may be conveyed to the mixer 104c such that the IF signal 302 may be down-converted to a baseband signal 304. The baseband signal 304 may be conveyed, for example, to a baseband processor such as the baseband processor 629.

Figure 6:
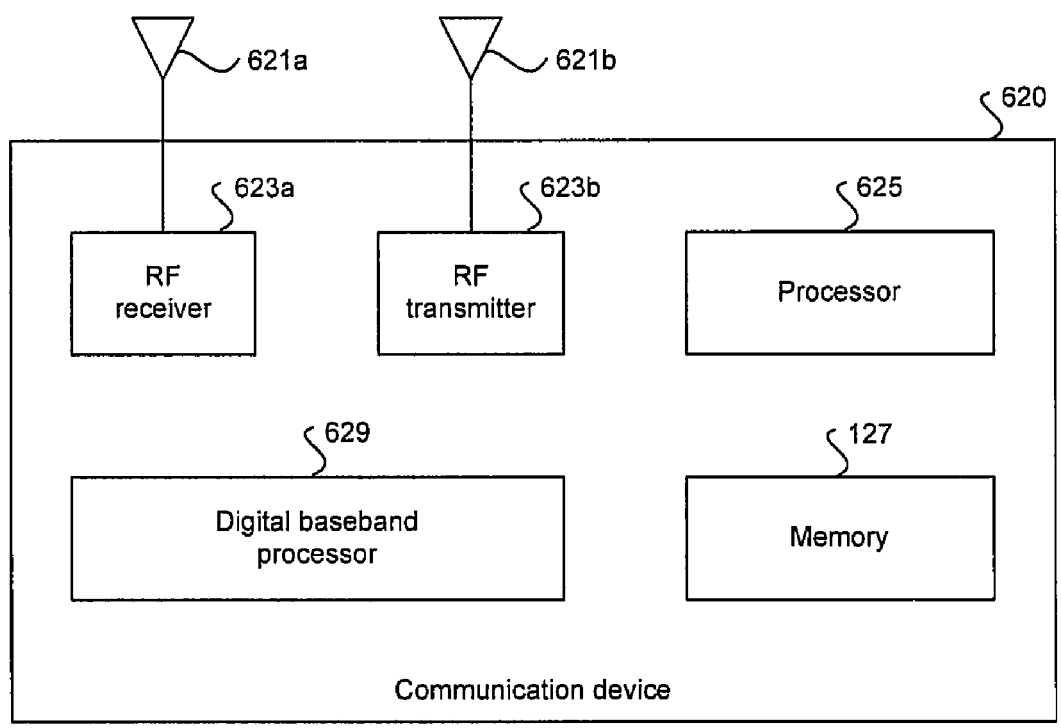
FIG. 6 is a block diagram illustrating an exemplary RF communication device, in accordance with an embodiment of the invention.

In an exemplary transmit operation, a baseband signal may be generated by, for example, the baseband processor 629 of FIG. 6. Accordingly, the baseband signal 312 and the LO signal 306 may be conveyed to the mixer 104d such that the baseband signal 312 may up-converted to an IF signal 310. The IF signal 310 and the LO signal 308 may be conveyed to the mixer 104b which may up-convert the IF signal 310 to RF for transmission via the PA 108 and the antenna 110b. In this regard, the gain of the PA 108 may be adjusted via one or more control signals from, for example, a processor such as the processors 625 and 629.

FIG. 4 is a block diagram illustrating a delay circuit for the generation of signals of up to extremely high frequencies, in accordance with an embodiment of the invention. Referring to FIG. 4 there is shown a delay circuit 128 which may comprise a plurality of delay elements 406, a plurality of capacitances 408, a switching element 410, and a mixer 404.

The delay elements 406 may each comprise suitable logic, circuitry, and/or code that may enable delaying an RF signal. In an exemplary embodiment of the invention, the delay elements 406 may comprise CMOS buffers and/or inverters. Additionally there may be 'n' delay elements $406_1$, $406_2$, ..., $406_n$. In one embodiment of the invention, each delay element 406 may introduce a time delay 'T'. In other embodiments of the invention, each of the delay elements 406 may be enabled to generate a fixed phase delay. Accordingly, in one aspect of the invention, a plurality of the delay elements may be configured so as to generate a variable delay.

Each of the capacitances 408 may comprise one or more capacitors which may be programmatically controlled. In one embodiment of the invention, each capacitance 408 may comprise a plurality of capacitors coupled via a switch network. Accordingly, the capacitance may be controlled via a digital control word. In another embodiment of the invention, each capacitance 408 may comprise one or more varactors which may be programmably controlled via one or more voltages. The processor 625 of FIG. 6 may be utilized to generate or acquire the digital control word, which may be utilized for programmably controlling the capacitance 408.

The switching element 410 may comprise suitable logic, circuitry, and/or code that may enable selecting which delay element 406 output to route to the mixer 404. An amount by which a signal is delayed may be proportional to the number of delay elements 406 through which the signal propagates. In this manner, the amount of delay introduced may be coarsely tuned by altering the number of delay elements through which a signal propagates. Accordingly, a number of delay elements which introduces a delay closest to 90° may be selected.

The mixer 404 may comprise suitable logic, circuitry, and/ or code that may enable generation of inter-modulation products resulting from mixing the input signal 412 and the delayed signal 414. In various embodiments of the invention, the output of the mixer may be filtered such that desired inter-modulation products are passed with less attenuation than undesired inter-modulation products. For example, the output may be bandpass filtered with a center frequency of $2*F_{in}$.

Figure 5:
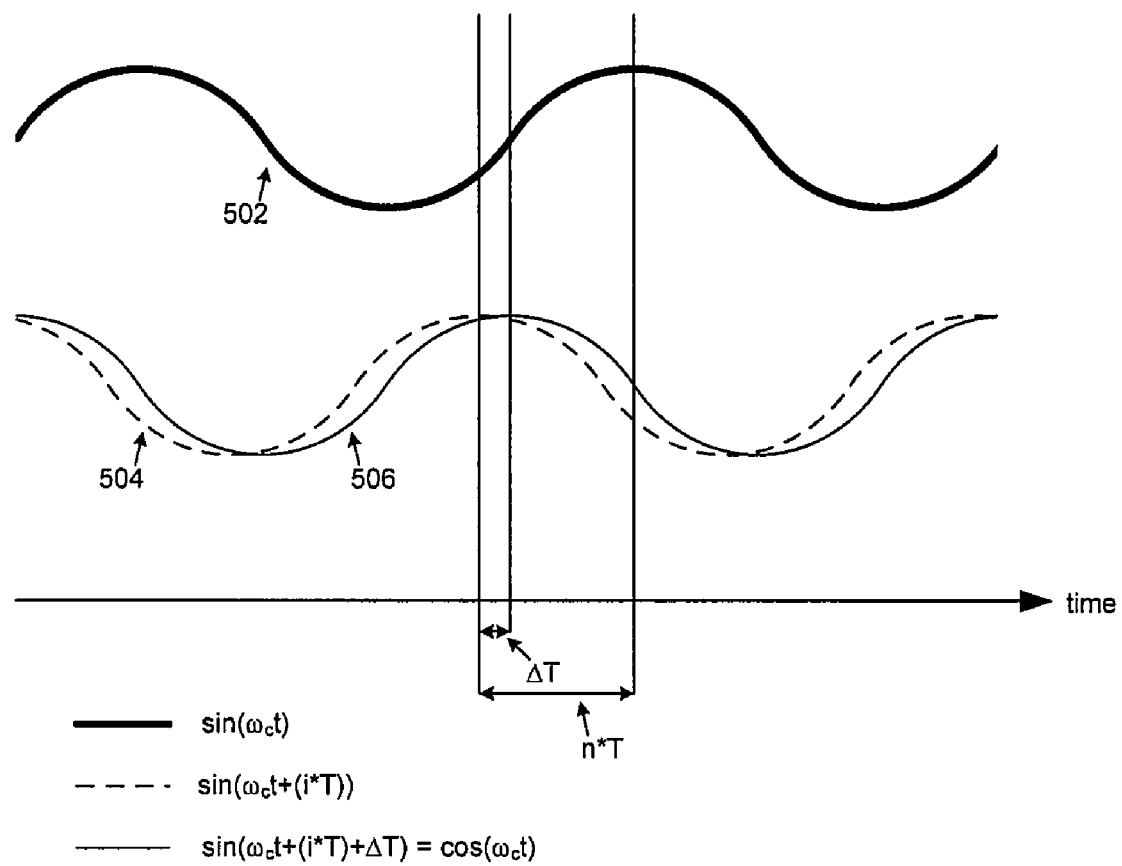
FIG. 5 is a diagram illustrating operation of a digital delay, in accordance with an embodiment of the invention.

In operation, the delay circuit 128 may enable doubling the frequency of an input signal 412. In this regard, the input signal 412, with frequency, $F_{in}$, may be represented as sin $(\omega_c t)$, where '$\omega_c$' is angular frequency and 't' is time. The reference signal 412 may be coupled to the mixer 404 and to a first of one or more delay elements 406. The one or more delay elements 406 combined with one or more capacitances may enable delaying $F_{in}$ by 90°, thus generating a signal which may be represented as $\cos(\omega_c t)$. In this regard, controlling the number of delay elements 406 through which the signal propagates may enable course control of the amount of delay. Additionally, controlling the amount of capacitance 408 may enable fine control of the amount of delay. The delayed signal 414 may be applied to a second input of the mixer 404. Accordingly, mixing a signal that may be represented by $\sin(\omega_c t)$ with signal that may be represented by $\cos(\omega_c t)$ may result in a signal that may be represented by $\sin(2\omega_c t)$ FIG. 5 is a diagram illustrating operation of a delay circuit, in accordance with an embodiment of the invention. Referring to FIG. 5, there is shown a sine wave 502, and two delayed signals and 506.

The sine wave 502 may, for example, comprise a reference signal such as the input signal 412 of FIG. 4. In this regard, the sine wave 502 may be output by a signal generator circuit such as a phase locked loop (PLL) or a direct digital frequency synthesizer (DDFS). In this regard, a maximum frequency of the sine wave 502 may be limited due to limitations of the signal generation circuit. Accordingly, by utilizing high speed delay circuits and a mixer, higher frequencies may be generated from the signal 502.

The signal 504 may comprise a delayed version of the signal 502. In this regard, the signal 504 may be delayed by an integer multiple of fixed time periods, T. Accordingly, the signal 504 may be the output of a cascade of one or more delay elements 406. In this manner, by controlling the number of delay elements 406 through which the signal 502 propagates, the signal 504 may be delayed by an amount roughly equal to 900 relative the signal 502.

The signal 506 may comprise a delayed version of the signal 502. In this regard, the signal 506 may be delayed by an integer multiple of fixed time periods, T, plus an amount ΔT. Accordingly, the signal 506 may be the output of a cascade of one or more delay elements 406 with one or more capacitances 408 coupled to the output. In this manner, by controlling the capacitance 408, the signal 506 may be delayed by an amount more precisely equal to 90° relative the signal 502.

FIG. 6 is a block diagram illustrating an exemplary RF communication device, in accordance with an embodiment of the invention. Referring to FIG. 6, there is shown a RF communication device 620 that may comprise an RF receiver 623a, an RF transmitter 623b, a digital baseband processor 629, a processor 625, and a memory 627. A receive antenna 621a may be communicatively coupled to the RF receiver 623a. A transmit antenna 621b may be communicatively coupled to the RF transmitter 623b. The RF communication device 620 may be operated in a system, such as the cellular network and/or digital video broadcast network, for example.

The RF receiver 623a may comprise suitable logic, circuitry, and/or code that may enable processing of received RF signals. The RF receiver 623a may enable receiving extremely high frequency (EHF) signals at, for example, approximately 60 GHz. In this regard, the receiver may be enabled to generate signals, such as local oscillator signals, for the reception and processing of EHF signals. The RF receiver 623a may down-convert received RF signals to a baseband frequency signal. In various embodiments of the invention, the RF receiver 623a may perform direct down-conversion of the received RF signal to a baseband frequency signal. In other embodiments of the invention, the RF receiver 623a may convert the RF signal to an IF prior to down-converting to baseband. In some instances, the RF receiver 623a may enable analog-to-digital conversion of the baseband signal components before transferring the components to the digital baseband processor 629. In other instances, the RF receiver 623a may transfer the baseband signal components in analog form.

The digital baseband processor 629 may comprise suitable logic, circuitry, and/or code that may enable processing and/or handling of baseband frequency signals. In this regard, the digital baseband processor 629 may process or handle signals received from the RF receiver 623a and/or signals to be transferred to the RF transmitter 623b. The digital baseband processor 629 may also provide control and/or feedback information to the RF receiver 623a and to the RF transmitter 623b based on information from the processed signals. The digital baseband processor 629 may communicate information and/or data from the processed signals to the processor 625 and/or to the memory 627. Moreover, the digital baseband processor 629 may receive information from the processor 625 and/or to the memory 627, which may be processed and transferred to the RF transmitter 623b for transmission to the network.

The RF transmitter 623b may comprise suitable logic, circuitry, and/or code that may enable processing of RF signals for transmission. The RF transmitter 623b may enable transmission of extremely high frequency (EHF) signals of, for example, approximately 60 GHz. In this regard, the transmitter may be enabled to generate signals, such as local oscillator signals, for the transmission and processing of EHF signals. The RF transmitter 623b may up-convert the baseband frequency signal to an RF signal. In various embodiments of the invention, the RF transmitter 623b may perform direct up-conversion of the baseband frequency signal to RF. In other embodiments of the invention, the RF transmitter 623b may up-convert the baseband frequency signal to an IF prior to up converting to RF. In some instances, the RF transmitter 623b may enable digital-to-analog conversion of the baseband signal components received from the digital baseband processor 629 before up-conversion. In other instances, the RF transmitter 623b may receive baseband signal components in analog form.

The processor 625 may comprise suitable logic, circuitry, and/or code that may enable control and/or data processing operations for the RF communication device 620. The processor 625 may be utilized to control at least a portion of the RF receiver 623a, the RF transmitter 623b, the digital baseband processor 629, and/or the memory 627. In this regard, the processor 625 may generate at least one signal for controlling operations within the RF communication device 620. The processor 625 may also enable executing of applications that may be utilized by the RF communication device 620. For example, the processor 625 may execute applications that may enable displaying and/or interacting with content received via RF signals in the RF communication device 620.

The memory 627 may comprise suitable logic, circuitry, and/or code that may enable storage of data and/or other information utilized by the RF communication device 620. For example, the memory 627 may be utilized for storing processed data generated by the digital baseband processor 629 and/or the processor 625. The memory 627 may also be utilized to store information, such as configuration information, that may be utilized to control the operation of at least one block in the RF communication device 620. For example, the memory 627 may comprise information necessary to configure the RF receiver 623a to enable receiving signals in the appropriate frequency band.

Aspects of a method and system for transmission and/or reception of signals up to EHF utilizing a delay circuit are provided. In this regard, a transceiver, such as the transceiver 100, may comprise at least one delay circuit, such as the delay circuit 128, which may, in turn, comprise a plurality of delay elements, such as the delay elements 406 and a variable capacitance, such as the variable capacitance 408. The delay circuit 128 may be enabled to delay a first signal, via at least a portion of the delay elements and via the variable capacitance, to generate a second signal that is 90° phase shifted relative to said first signal. Additionally, the delay circuit may be enabled to mix the first signal with the second signal to generate a third signal that is twice a frequency of the first signal. The third signal may be utilized for up-conversion and/or down-conversion of signals to and/or from baseband, intermediate frequencies, and/or RF frequencies of up to EHF. A plurality of the delay circuits may be cascaded. In this manner, one or more frequency conversions may utilize outputs of one or more of the cascaded delay circuits.

Another embodiment of the invention may provide a machine-readable storage, having stored thereon, a computer program having at least one code section executable by a machine, thereby causing the machine to perform the steps as described herein for transmission and/or reception of signals up to extremely high frequencies utilizing a delay circuit.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal generation, the method comprising:
transmitting and/or receiving signals of up to extremely high frequencies utilizing a local oscillator generator comprising at least one delay circuit, wherein said delay circuit comprises a plurality of delay elements and a variable capacitance, and wherein said delay circuit is enabled to:

delay a first signal, via at least a selected portion of said delay elements and via said variable capacitance, to generate a second signal that is 90° phase shifted relative to said first signal; and mix said first signal with said second signal to generate a third signal, wherein:
the frequency of said third signal is twice the frequency of said first signal;
said portion of said plurality of delay elements is selected based on a strength of said third signal; and
a capacitance of said variable capacitance is controlled based on said strength of said third signal.

2. The method according to claim 1, comprising up-converting baseband signals by mixing said baseband signals with said third signal.

3. The method according to claim 2, comprising up-converting said baseband signals directly to RF for transmission.

4. The method according to claim 1, comprising down-converting RF signals by mixing said RF signals with said third signal.

5. The method according to claim 4, comprising down-converting said RF signals directly to baseband.

6. The method according to claim 1, comprising cascading a plurality of said delay circuits.

7. The method according to claim 6, comprising utilizing said third signal of a first of said cascaded delay circuits for a first frequency conversion.

8. The method according to claim 6, comprising and utilizing said third signal of a second of said cascaded delay circuits for a second frequency conversion.

9. A non-transitory machine-readable storage having stored thereon, a computer program having at least one code section for signal generation, the at least one code section being executable by a machine for causing the machine to perform steps comprising:

transmitting and/or receiving signals of up to extremely high frequencies utilizing a local oscillator generator comprising at least one delay circuit, wherein said delay circuit comprises a plurality of delay elements and a variable capacitance, and wherein said delay circuit is enabled to:

delay a first signal, via at least a selected portion of said delay elements and via said variable capacitance, to generate a second signal that is 90° phase shifted relative to said first signal; and mix said first signal with said second signal to generate a third signal, wherein:
the frequency of said third signal is twice the frequency of said first signal;
said portion of said plurality of delay elements is selected based on a strength of said third signal; and
a capacitance of said variable capacitance is controlled based on said strength of said third signal.

10. The non-transitory machine-readable storage according to claim 9, wherein said at least one code section enables up-converting baseband signals by mixing said baseband signals with said third signal.

11. The non-transitory machine-readable storage according to claim 10, wherein said at least one code section enables up-converting said baseband signals directly to RF for transmission.

12. The non-transitory machine-readable storage according to claim 9, wherein said at least one code section enables down-converting RF signals by mixing said RF signals with said third signal.

13. The non-transitory machine-readable storage according to claim 12, wherein said at least one code section enables down-converting said RF signals directly to baseband.

14. The non-transitory machine-readable storage according to claim 9, wherein said at least one code section enables cascading a plurality of said delay circuits.

15. The non-transitory machine-readable storage according to claim 14, wherein said at least one code section enables utilizing said third signal of a first of said cascaded delay circuits for a first frequency conversion.

16. The non-transitory machine-readable storage according to claim 14, wherein said at least one code section enables and utilizing said third signal of a second of said cascaded delay circuits for a second frequency conversion.

17. A system for signal generation, the system comprising:
one or more circuits that enable transmission and/or reception of signals of up to extremely high frequencies utilizing a local oscillator generator comprising at least one delay circuit, wherein said delay circuit comprises a plurality of delay elements and a variable capacitance, and wherein said delay circuit is enabled to:

delay a first signal, via at least a selected portion of said delay elements and via said variable capacitance, to generate a second signal that is 90° phase shifted relative to said first signal; and mix said first signal with said second signal to generate a third signal, wherein:
the frequency of said third signal is twice the frequency of said first signal;
said portion of said plurality of delay elements is selected based on a strength of said third signal; and
a capacitance of said variable capacitance is controlled based on said strength of said third signal.

18. The system according to claim 17, wherein said one or more circuits enable up-conversion of baseband signals by mixing said baseband signals with said third signal.

19. The system according to claim 18, wherein said one or more circuits enable up-conversion of said baseband signals directly to RF for transmission.

20. The system according to claim 17, wherein said one or more circuits enable down-conversion of RF signals by mixing said RF signals with said third signal.

21. The system according to claim 20, wherein said one or more circuits enable down-conversion of said RF signals directly to baseband.

22. The system according to claim 17, wherein said one or more circuits enable cascading a plurality of said delay circuits.

23. The system according to claim 22, wherein said one or more circuits enable utilization of said third signal of a first of said cascaded delay circuits for a first frequency conversion.

24. The system according to claim 22, wherein said one or more circuits enable utilization of said third signal of a second of said cascaded delay circuits for a second frequency conversion.

* * * * *